(12) United States Patent
Shreter et al.

(10) Patent No.: US 9,966,296 B2
(45) Date of Patent: May 8, 2018

(54) METHOD OF LASER SEPARATION OF THE EPITAXIAL FILM OR THE EPITAXIAL FILM LAYER FROM THE GROWTH SUBSTRATE OF THE EPITAXIAL SEMICONDUCTOR STRUCTURE (VARIATIONS)

(71) Applicants: Yury Georgievich Shreter, Saint-Petersbrug (RU); Yury Toomasovich Rebane, Saint-Petersburg (RU); Aleksey Vladimirovich Mironov, Saint-Petersburg (RU)

(72) Inventors: Yury Georgievich Shreter, Saint-Petersbrug (RU); Yury Toomasovich Rebane, Saint-Petersburg (RU); Aleksey Vladimirovich Mironov, Saint-Petersburg (RU)

(*) Notice: Subject to any disclaimer, the term of this patent is extended or adjusted under 35 U.S.C. 154(b) by 0 days. days.

(21) Appl. No.: 14/907,189

(22) Filed: Jan. 22, 2016

(65) Prior Publication Data

US 2016/0172228 A1    Jun. 16, 2016

Related U.S. Application Data

(62) Division of application No. 14/129,594, filed as application No. PCT/RU2012/000588 on Jul. 13, 2012, now Pat. No. 9,337,025.

(30) Foreign Application Priority Data

Jul. 13, 2011 (RU) ................................ 2011129184

(51) Int. Cl.
*H01L 21/268* (2006.01)
*H01L 21/683* (2006.01)
(Continued)

(52) U.S. Cl.
CPC ...... *H01L 21/6835* (2013.01); *H01L 21/0254* (2013.01); *H01L 21/0257* (2013.01);
(Continued)

(58) Field of Classification Search
CPC ........... H01L 21/76254; H01L 21/6835; H01L 21/268; H01L 2221/68381;
(Continued)

(56) References Cited

U.S. PATENT DOCUMENTS 6,221,738 B1 * 4/2001 Sakaguchi .......... H01L 21/2007
117/104
6,323,108 B1 * 11/2001 Kub .................. H01L 21/76254
257/E21.568
(Continued)

FOREIGN PATENT DOCUMENTS

EP    1865551 A2    12/2007
EP    2357660 A1    8/2011
(Continued)

OTHER PUBLICATIONS

Miskys, C.R., et al., "Freestanding GaN-substrates and devices", Physica Status Solidi, Wiley-VCH Verlag, Berlin, DE, No. 6, Sep. 1, 2003, pp. 1627-1650.
(Continued)

*Primary Examiner* — Mary Wilczewski
(74) *Attorney, Agent, or Firm* — Hoffmann & Baron, LLP

(57) ABSTRACT

The present invention proposes variations of the laser separation method allowing separating homoepitaxial films from the substrates made from the same crystalline material as the epitaxial film. This new method of laser separation is based on using the selective doping of the substrate and epitaxial film with fine donor and acceptor impurities. In selective doping, concentration of free carries in the epitaxial film and substrate may essentially differ and this can lead to strong
(Continued)

difference between the light absorption factors in the infrared region near the residual beams region where free carriers and phonon-plasmon interaction of the optical phonons with free carriers make an essential contribution to infrared absorption of the optical phonons. With the appropriate selection of the doping levels and frequency of infrared laser radiation, it is possible to achieve that laser radiation is absorbed in general in the region of strong doping near the interface substrate-homoepitaxial film. When scanning the interface substrate-homoepitaxial film with the focused laser beam of sufficient power, thermal decomposition of the semiconductor crystal takes place with subsequent separation of the homoepitaxial film. The advantage of the proposed variations of the method for laser separation of epitaxial films in comparison with the known ones is in that it allows the separation of homoepitaxial films from the substrates, i.e., homoepitaxial films having the same width of the forbidden gap as the initial semiconductor substrate has. The proposed variations of the method can be used for separation of the epitaxial films.

10 Claims, 4 Drawing Sheets

(51) Int. Cl.
  *H01L 21/02* (2006.01)
  *H01L 21/762* (2006.01)
  *H01L 33/00* (2010.01)

(52) U.S. Cl.
  CPC .. *H01L 21/02518* (2013.01); *H01L 21/02527* (2013.01); *H01L 21/02529* (2013.01); *H01L 21/02532* (2013.01); *H01L 21/02546* (2013.01); *H01L 21/02551* (2013.01); *H01L 21/02634* (2013.01); *H01L 21/268* (2013.01); *H01L 21/76254* (2013.01); *H01L 33/0079* (2013.01); *H01L 2221/68381* (2013.01)

(58) Field of Classification Search
  CPC ......... H01L 21/02518; H01L 21/02527; H01L 21/02529; H01L 21/02532; H01L 21/0254; H01L 21/02546; H01L 21/02551; H01L 21/0257; H01L 21/02634; H01L 33/0079
  See application file for complete search history.

(56) References Cited

U.S. PATENT DOCUMENTS

| | | | |
|---|---|---|---|
| 6,372,608 B1 * | 4/2002 | Shimoda | G02F 1/13454 257/E21.567 |
| 6,486,008 B1 * | 11/2002 | Lee | H01L 21/76254 257/E21.568 |
| 6,794,276 B2 * | 9/2004 | Letertre | C30B 25/02 257/E21.054 |
| 6,838,358 B2 * | 1/2005 | Maurice | H01L 21/76254 257/E21.568 |
| 6,861,335 B2 * | 3/2005 | Ueda | B82Y 20/00 257/E21.347 |
| 6,951,799 B2 * | 10/2005 | Roche | H01L 21/76254 257/E21.568 |
| 6,964,914 B2 * | 11/2005 | Ghyselen | H01L 21/76254 257/E21.127 |
| 6,974,759 B2 * | 12/2005 | Moriceau | H01L 21/76256 257/E21.568 |
| 7,008,859 B2 * | 3/2006 | Letertre | H01L 21/76254 257/E21.152 |
| 7,008,860 B2 * | 3/2006 | Kakizaki | H01L 21/76256 257/E21.568 |
| 7,018,909 B2 * | 3/2006 | Ghyselen | H01L 21/324 257/E21.119 |
| 7,045,878 B2 * | 5/2006 | Faris | B81C 1/0038 257/618 |
| 7,226,509 B2 * | 6/2007 | Faure | C30B 25/183 117/89 |
| 7,261,777 B2 * | 8/2007 | Faure | C30B 25/18 117/89 |
| 7,399,693 B2 * | 7/2008 | Sekiguchi | H01L 21/76251 257/E21.121 |
| 7,449,394 B2 * | 11/2008 | Akatsu | H01L 21/76254 257/E21.568 |
| 7,601,217 B2 * | 10/2009 | Faure | C30B 25/18 117/103 |
| 7,608,471 B2 * | 10/2009 | Bahl | H01L 21/2007 257/E33.001 |
| 7,943,484 B2 * | 5/2011 | Eichler | H01L 33/0079 257/79 |
| 8,093,138 B2 * | 1/2012 | Faure | C30B 25/18 257/E21.568 |
| 8,546,245 B2 * | 10/2013 | Akiyama | H01L 21/76254 257/E21.127 |
| 8,828,845 B2 * | 9/2014 | Kang | H01L 21/02565 257/E21.122 |
| 9,308,715 B2 * | 4/2016 | Imai | B32B 38/10 |
| 9,337,025 B2 * | 5/2016 | Shreter | H01L 21/76254 |
| 9,548,246 B2 * | 1/2017 | Fujii | B23K 26/0057 |
| 9,553,023 B2 * | 1/2017 | Fujii | B23K 26/0057 |
| 2003/0008437 A1 * | 1/2003 | Inoue | H01L 21/6835 438/149 |
| 2003/0008477 A1 * | 1/2003 | Kang | H01L 21/304 438/458 |
| 2003/0162367 A1 * | 8/2003 | Roche | H01L 21/76254 438/460 |
| 2004/0058555 A1 * | 3/2004 | Moriceau | H01L 21/26506 438/736 |
| 2004/0229444 A1 * | 11/2004 | Couillard | H01L 21/76254 438/455 |
| 2004/0241958 A1 * | 12/2004 | Guarini | H01L 21/6835 438/455 |
| 2004/0241960 A1 * | 12/2004 | Maurice | H01L 21/76254 438/458 |
| 2005/0009288 A1 * | 1/2005 | Cheng | H01L 21/02381 438/407 |
| 2005/0059218 A1 * | 3/2005 | Faris | B81C 1/0038 438/455 |
| 2005/0173387 A1 * | 8/2005 | Fukuyo | B23K 26/0057 219/121.67 |
| 2005/0245049 A1 * | 11/2005 | Akatsu | H01L 21/76254 438/458 |
| 2007/0026650 A1 * | 2/2007 | Hebras | H01L 21/76254 438/514 |
| 2009/0278233 A1 | 11/2009 | Pinnington et al. | |
| 2010/0015783 A1 * | 1/2010 | Fukuyo | B23K 26/0057 438/463 |
| 2011/0095400 A1 * | 4/2011 | Garnier | H01L 21/76254 257/615 |
| 2014/0038392 A1 * | 2/2014 | Yonehara | H01L 21/304 438/463 |
| 2016/0172228 A1 * | 6/2016 | Shreter | H01L 21/76254 438/478 |

FOREIGN PATENT DOCUMENTS

| | | | |
|---|---|---|---|
| EP | 1 664 396 B1 * | 9/2011 | C30B 25/02 |
| FR | 2857982 A1 | 1/2005 | |

(56) References Cited

FOREIGN PATENT DOCUMENTS

| WO | WO 2005/014895 | * | 2/2005 | ............. C30B 25/02 |
| WO | WO 2010/067835 A1 | | 6/2010 | |

OTHER PUBLICATIONS

International Search Report issued in PCT/RU2012/000588 on Dec. 11, 2012.

* cited by examiner

METHOD OF LASER SEPARATION OF THE EPITAXIAL FILM OR THE EPITAXIAL FILM LAYER FROM THE GROWTH SUBSTRATE OF THE EPITAXIAL SEMICONDUCTOR STRUCTURE (VARIATIONS)

CROSS-REFERENCE TO RELATED APPLICATIONS

This application is a divisional application of U.S. application Ser. No. 14/129,594, filed on Dec. 27, 2013; which claims benefit of the U.S. National Phase of International Patent Application No. PCT/RU2012/000588, filed on Jul. 13, 2012; which claims benefit of Russian Patent Application No. 2011129184, filed on Jul. 13, 2011, the contents of which are incorporated herein by reference in their entireties.

TECHNICAL FIELD

Group of the inventions relates to the laser treatment of the solid materials, in particular, to the method of separation of the semiconductors' surface layers with laser radiation, namely the laser separation of the epitaxial film or of the epitaxial film layer from the growth substrate of the epitaxial semiconductor structure.

BACKGROUND ART

Laser separation of the epitaxial layers of the semiconductor crystals from the growth substrates with their transfer on to the ungrowth substrates is widely used now in manufacturing of the light diodes (U.S. Pat. No. 7,241,667, U.S. Pat. No. 7,202,141) and laser diodes (U.S. Pat. No. 6,365,429) according to the flip-chip technology.

In the first time, laser separation of the gallium nitride layers from the transparent growth sapphire substrates was proposed in the work Kelly et al Physica Status Solidi (a) vol. 159, pp. R3, R4, (1997). In this work the ultraviolet excimer laser with wave length λ=355 nm satisfying the ratio $2\pi hc/E_{g1} < \lambda < 2\pi hc/E_{g2}$ was used, for which the quantum energy is within the forbidden gap of the substrate $E_{g1}$ made of sapphire, but exceeds the width of the forbidden gap of the epitaxial film $E_{g2}$, consisting of gallium nitride.

Later, the method of laser separation based on the difference between the widths of the forbidden gaps of the growth substrate and epitaxial film was improved. In particular, to improve quality of the separated epitaxial film and to suppress its cracking, it was proposed to use additional sacrifial layer with the width of the forbidden gap less than the widths of the forbidden gaps of the growth substrate and epitaxial film, as well to use scanning of the heteroepitaxial interface between the growth substrate and epitaxial film (U.S. Pat. No. 6,071,795, U.S. Pat. No. 6,365,429).

The general scheme of the laser separation methods based on the difference between the widths of the forbidden gaps of the growth substrate and epitaxial film is shown in FIG. 1.

When exposing to ultraviolet from the side of the substrate from heteroepitaxial semiconductor gallium nitride film 102 grown on the substrate 101 of sapphire having the width of the forbidden gap more than the light quantum energy, ultraviolet laser radiation passes through sapphire and is absorbed in the thin layer of gallium nitride nearby the heteroepitaxial interface 105 gallium nitride—sapphire. On exposure to ultraviolet laser radiation, gallium nitride in the area 104 defined by crossing of the ultraviolet laser radiation 103 with heteroepitaxial interface 105 is heated up to the temperature $T_1$, exceeding the decomposition temperature $T_0 \sim 900°$ C., and decomposes into gaseous nitrogen and liquid gallium, and as a result epitaxial film of gallium nitride separates from sapphire.

All before proposed methods of laser separation of epitaxial films from the growth substrates are based on the difference between the widths of the forbidden gaps of the epitaxial film $E_{g2}$ and substrate $E_{g1}$. These methods can be successfully used for separating the epitaxial films obtained using heteroepitaxy method, i.e., technology of growing the epitaxial film onto the growth substrate made of the material which differs from the epitaxial film material.

However, to obtain high quality epitaxial films without integrated mechanical stresses, it is often happened to be necessary to use a homoepitaxy method, which provides growing of the epitaxial film on the growth substrate from the same material as the epitaxial film. In this case growth substrate and epitaxial film have an equal width of the forbidden gap, and the usual laser separation method disclosed above becomes unapplied.

The object of the present invention is an expansion of the method application field, namely providing the possibility of separating the epitaxial films from the substrates made of the same crystal material as the epitaxial film.

SUMMARY OF INVENTION

To solve this object, two variations of the method for laser separation of the epitaxial film or epitaxial film layer from the growth substrate of the epitaxial semiconductor structure were proposed.

In the first variation of the method in growing the epitaxial film or epitaxial film layer, selective doping with small donor or acceptor impurities of some areas of the epitaxial structure is used, so that the resulting concentration of the small impurities in the selectively doped areas substantially exceeds the background concentration in the undoped areas. Then, the focused laser beam is directed onto the epitaxial structure consisting of the substrate and epitaxial film so that the beam focus is placed in the selectively doped areas of the crystal structure in which absorption of the laser radiation takes place. Laser beam is moved with scanning the selectively doped areas of the epitaxial structures with beam focus with partial thermal decomposition of selectively doped areas and decreasing their mechanical strength. After laser scanning the epitaxial structure is glued on the temporary substrate and the epitaxial film or the epitaxial film layer is separated from the growth substrate or the growth substrate with a part of the epitaxial film by applying mechanical or thermomechanical stress.

The second variation of the method is characterized by the same features, and differs from the first method in that the epitaxial structure is glued on the temporary substrate before laser scanning, then laser scanning of the epitaxial structure glued on the temporary substrate is performed, and after laser scanning the epitaxial film or the epitaxial film layer is separated from the growth substrate or the growth substrate with a part of the epitaxial film by applying mechanical or thermomechanical stress.

Preferably, the epitaxial film or the epitaxial film layer is grown by the homoepitaxy method.

Preferably, the selectively doped area is the substrate or the surface layer of the substrate.

Preferably, the selectively doped area is the epitaxial film or the lower layer of the epitaxial film.

Preferably, the material of the crystalline structure consisting of the substrate and epitaxial film, is the semiconductor from the elements of the forth group or the semiconductor compound from the elements of the forth group, or the semiconductor compound from the elements of the third and fifth group, or the semiconductor compound from the elements of the second and sixth group of the periodic system.

Preferably, the laser wave length for separating the homoepitaxial films from the growth substrate is in the following wave length range: for silicon, germanium and gallium arsenide semiconductors in the range of 6 µm≤λ≤48 µm, for gallium nitride in the range of 4 µm≤λ≤32 µm, for silicon carbide 3 µm≤λ≤24 µm, for alumina nitride in the range of 2.5 µm≤λ≤20 µm, and for diamond 2 µm≤λ≤16 µm.

Preferably, infrared gas pulse pumped silicon dioxide $CO_2$ or silicon oxide CO is used as a laser.

The proposed variations of the laser separation method allow separating the homoepitaxial films from the substrates made of the same crystalline material as the epitaxial film. This new laser separation method is based on the usage of the selective doping of the substrate and epitaxial film with the fine donor or acceptor impurities. In the selective doping, concentrations of the free carriers in the epitaxial film and substrate may significantly differ, and this can lead to a strong difference between the light absorption factors in the infrared region near the region of the residual beams, where free carriers and phonon-plasmon interaction of the optical phonons with free carriers make an essential contribution to infrared absorption of the optical phonons.

With the appropriate selection of the doping levels and frequency of infrared laser radiation it is possible to achieve that laser radiation is absorbed in general in the region of strong doping near the interface substrate-homoepitaxial film. When scanning the interface substrate-homoepitaxial film with the focused laser beam of sufficient power, thermal decomposition of the semiconductor crystal takes place with subsequent separation of the homoepitaxial film.

To realize the proposed method of laser separation, it is preferably to use laser radiation with wave length λ being within the infrared region of relative transparence of the undoped semiconductor, namely near the edge of the residual beams region where a strong absorption of light at the expense of one- or two-phonon processes is not possible, but a relatively weak absorption of light may present at the expense of three- or more phonon processes.

Preferably, wave length λ of the laser beam is within the range of $c/4v_0 \leq \lambda \leq 2c/v_0$, where $v_0$ is a frequency of LO-optical phonon for a semiconductor material of the growth substrate, c is a light velocity.

The inequality given above follows that the preferable laser wave length for separating the homoepitaxial films from the growth substrate is within the following wave length ranges: for silicon, germanium and gallium arsenide semiconductors in the range of 6 µm≤λ≤48 µm, for gallium nitride in the range of 4 µm≤λ≤32 µm, for silicon carbide 3 µm≤λ≤24 µm, for alumina nitride in the range of 2.5 µm≤λ≤20 µm, and for diamond 2 µm≤λ≤16 µm.

The technical result of the proposed invention consists in offering a new method of laser separation of the epitaxial films in comparison with the known ones which allows to separate homoepitaxial films from the substrates, i.e., homoepitaxial films having the same width of the forbidden gap as the initial semiconductor substrate. Also, the proposed method allows using the high-effective and inexpensive infrared gas silicon dioxide $CO_2$ or silicon oxide CO lasers for separation of the epitaxial films.

BRIEF DESCRIPTION OF THE DRAWINGS

The present invention is illustrated by the drawings in which the prior art is shown FIG. 1, schemes illustrating the realization of the present invention FIGS. 2-5, and calculated spectral dependences of the light absorption factor in gallium nitride at various levels of doping with fine donor impurities FIG. 6.

DETAILED DESCRIPTION OF THE INVENTION

The present invention will become readily apparent from the following detailed description of exemplary embodiments. It should be noted that the consequent description of these embodiments is only illustrative, but not exhaustive.

Example 1

Separation of homoepitaxial gallium nitride film doped with fine donor impurities from the undoped semiconductor gallium nitride substrate with laser beam passing through the substrate.

Figure 1:
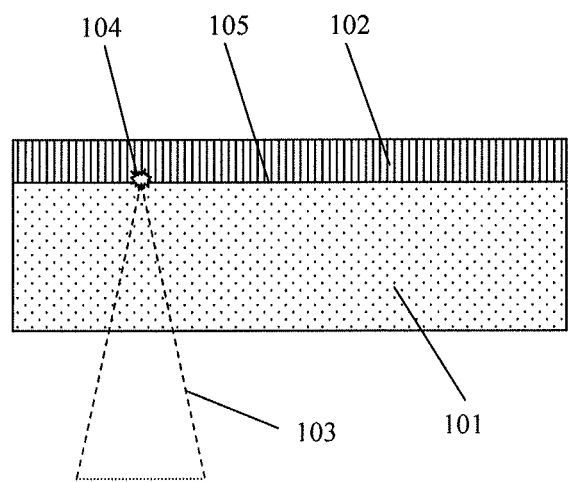
FIG. 1 shows the scheme of the known prior art method of laser separation of the heteroepitaxial film of semiconductor crystal from a foreign growth substrate using focused laser radiation with wave length λ for which a light quantum energy is within the forbidden gap of the substrate $E_{g1}$, and exceeds the width of the forbidden gap of the epitaxial film $E_{g2}$ material.
Figure 2:
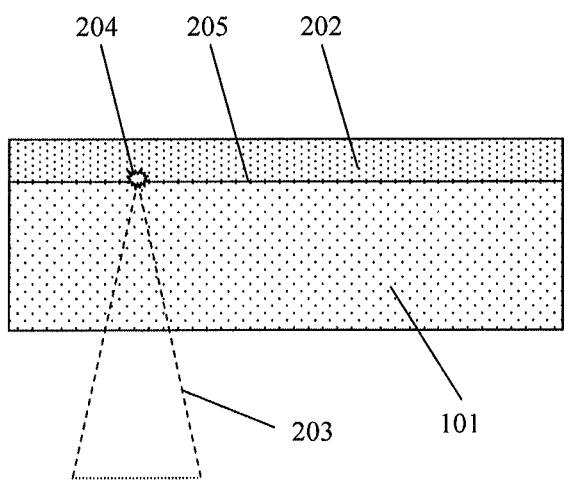
FIG. 2 shows a scheme illustrating the proposed method of laser separation of the homoepitaxial film from the semiconductor substrate consisting of the same semiconductor material as the homoepitaxial film. The scheme illustrates laser separation for the case of selective doping the substrate and homoepitaxial film with fine donor or acceptor impurities when the doping level in the homoepitaxial film exceeds the doping level in the semiconductor substrate.

FIG. 2 shows a scheme of laser separation of homoepitaxial gallium nitride film 202, 50 µm wide from the semiconductor gallium nitride substrate 101, 200 µm wide.

Level of doping with fine silicon donor impurities in the homoepitaxial film 202 is of $5\cdot10^{19}$ cm$^{-3}$, and exceeds the background concentration of fine oxygen and silicon donors in the semiconductor substrate 101 equalled $10^{17}$ cm$^{-3}$.

For separating of the homoepitaxial gallium nitride film, $CO_2$ pulse pumped laser is used operating at the wave length $\lambda=10.6$ μm and generating pulses of energy 0.1 J, duration 50 ns and repetition rate 100 Hz.

Absorption factor of laser radiation with wave length $\lambda=10$ μm in the homoepitaxial gallium nitride film 202 doped with fine silicon donor impurities of concentration $5\cdot10^{19}$ cm$^{-3}$, equals $4\cdot10^4$ cm$^{-1}$, whereas the absorption factor of this radiation in the undoped semiconductor gallium nitride substrate 101 with background concentration of fine oxygen and silicon donors equalled $10^{17}$ cm$^{-3}$ is $5\cdot10^1$ cm$^{-1}$.

Figure 6:
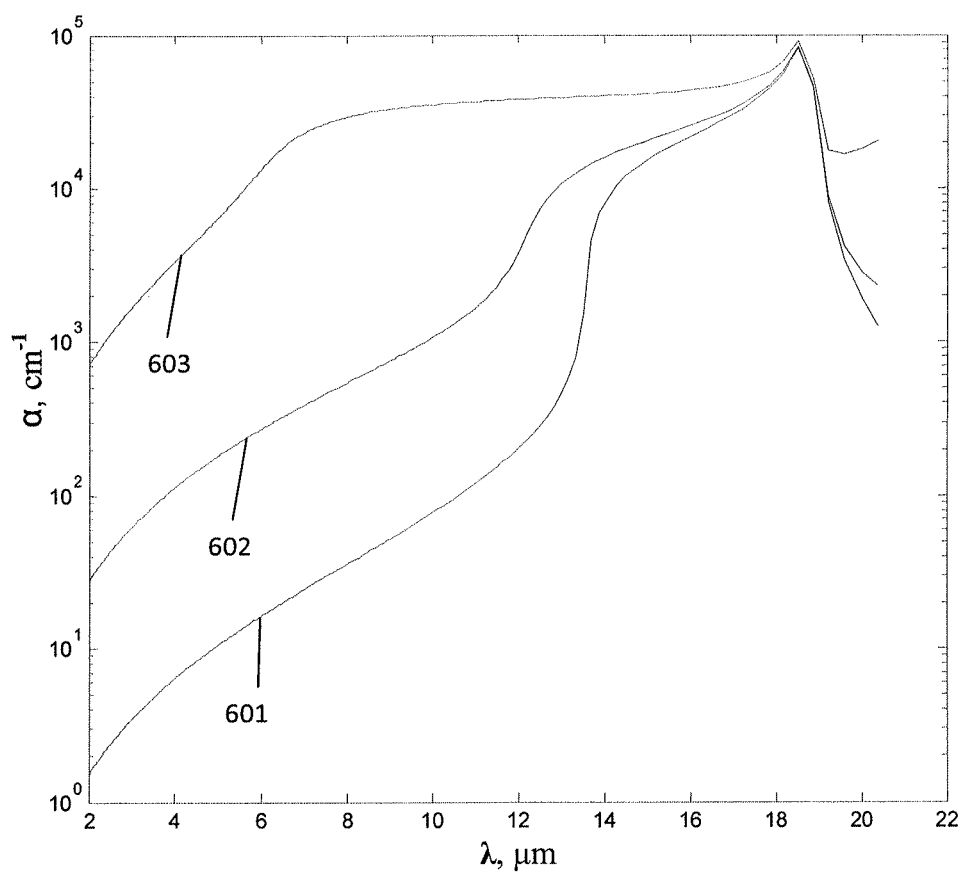
FIG. 6 shows the calculated spectral dependences of the light absorption factor near the residual beams region for semiconductor crystal of gallium nitride at various levels of doping with fine donor impurities. Dependences 601, 602 and 603 refer to the doping levels $10^{17}$, $10^{18}$ and $5 \cdot 10^{19}$ cm$^{-3}$ respectively.

The respective spectral dependences of the light absorption factor near the residual beams region which we calculated for the semiconductor gallium nitride crystals with different levels of doping with fine donor impurities are given in FIG. 6. The curves 601, 602 and 603 refer to the doping levels $10^{17}$, $10^{18}$ and $5\cdot10^{19}$ cm$^3$ respectively.

Scheme in FIG. 2 shows that infrared laser beam 203 passes through the substrate 101 and is focused into the spot 1 mm in diameter which provides the energy density of 10 J/cm$^2$. Under the action of infrared laser beam 203 of pulse $CO_2$ laser with wave length $\lambda=10$ μm focused into the spot 1 mm in diameter weakly absorbed in the undoped semiconductor gallium nitride substrate 101 and strongly absorbed in the homoepitaxial gallium nitride film 202 doped with fine donor impurities, local heating of the homoepitaxial film 202 takes place in the region 204 defined by crossing of the infrared laser beam 203 with the homoepitaxial interface 205 between the undoped semiconductor substrate 101 and the doped homoepitaxial film 202. Local heating above temperature 900° C. leads to chemical decomposition of gallium nitride crystal into gaseous nitrogen and liquid gallium in the region 204. Movement of the laser beam 203 focus with velocity of 10 cm/s in the horizontal plane which is parallel to homoepitaxial interface 205 leads to subsequent decomposition of gallium nitride in the set of regions 204 and weakening of the homoepitaxial interface 205 between the undoped semiconductor substrate 101 and the doped homoepitaxial film 202. Then when pasting the homoepitaxial film 202 on the temporary metallic ceramic or plastic substrate and applying small mechanical or thermomechanical stress it is possible to separate the homoepitaxial film 202 from the substrate 101.

Example 2

Separation of undoped homoepitaxial gallium nitride film from semiconductor gallium nitride substrate doped with fine donor impurities, by means of laser beam passing through the homoepitaxial film.

Figure 3:
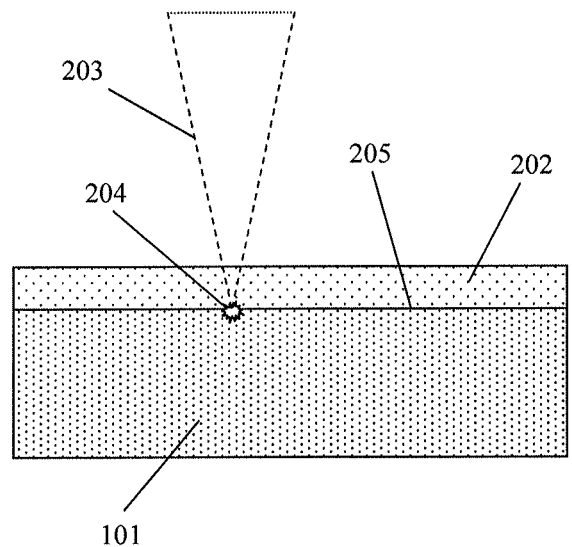
FIG. 3 shows a scheme illustrating the proposed method of laser separation of the homoepitaxial film from the semiconductor substrate consisting of the same semiconductor material as the homoepitaxial film. The scheme illustrates laser separation for the case of selective doping the substrate and homoepitaxial film with fine donor or acceptor impurities when the doping level in the semiconductor substrate exceeds the doping level in the homoepitaxial film.

FIG. 3 shows the scheme of laser separation of undoped homoepitaxial gallium nitride film 100 μm thick from semiconductor gallium nitride substrate 1 mm thick. The background concentration of fine oxygen and silicon donors in the homoepitaxial film 202 is $10^{17}$ cm$^{-3}$ and is essentially less than the concentration of fine silicon donor impurities in the doped semiconductor substrate 101 equalled $5\cdot10^{19}$ cm$^{-3}$.

For separating of the homoepitaxial gallium nitride film, $CO_2$ pulse pumped laser is used operating at the wave length $\lambda=10.6$ μm and generating pulses of energy 0.1 J, duration 50 ns and repetition rate 100 Hz. Absorption factor of laser radiation with wave length $\lambda=10$ μm in the undoped homoepitaxial gallium nitride film 202, with background concentration of fine oxygen and silicon donors equalled $10^{17}$ cm$^{-3}$, is of $5\cdot10^1$ cm$^{-1}$, whereas the absorption factor of this radiation in the semiconductor gallium nitride substrate 101 doped with fine silicon donor impurities of concentration $5\cdot10^{19}$ cm$^{-3}$, equals $4\cdot10^4$ cm$^{-1}$. The respective spectral dependences of the light absorption factor near the residual beams region which we calculated for the semiconductor gallium nitride crystals with different levels of doping with fine donor impurities are given in FIG. 6. The curves 601, 602 and 603 refer to the doping levels $10^{17}$, 1018 and $5\cdot10^{19}$ cm$^3$ respectively.

Scheme in FIG. 3 shows that the infrared laser beam 203 passes through homoepitaxial film 202 and focused into the spot 1 mm in diameter which provides the energy density of 10 J/cm$^2$.

Under the action of infrared laser beam 203 of pulse $CO_2$ laser with wave length $\lambda=10.6$ μm focused into the spot 1 mm in diameter weakly absorbed in the undoped homoepitaxial gallium nitride film 202 and strongly absorbed in the semiconductor gallium nitride substrate 101 doped with fine donor impurities, local heating of the substrate 101 takes place in the region 204 defined by crossing of the infrared laser beam 203 with the homoepitaxial interface 205 between the doped semiconductor substrate 101 and the undoped homoepitaxial film 202. Local heating above temperature 900° C. leads to chemical decomposition of gallium nitride crystal into gaseous nitrogen and liquid gallium in the region 204. Movement of the laser beam 203 focus with velocity of 10 cm/s in the horizontal plane which is parallel to homoepitaxial interface 205 leads to the subsequent decomposition of gallium nitride in the set of regions 204 and to weakening of the homoepitaxial interface 205 between the doped semiconductor substrate 101 and the undoped homoepitaxial film 202. Then when pasting the homoepitaxial film 202 on the temporary metallic, ceramic or plastic substrate and applying a small mechanical or thermomechanical stress it is possible to separate the homoepitaxial film 202 from the substrate 101.

Example 3

Figure 4:
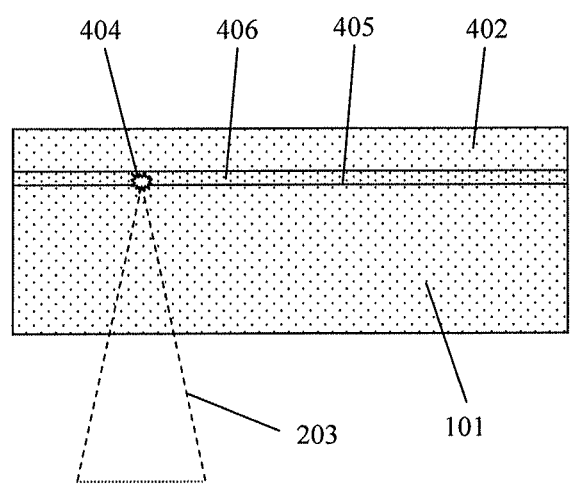
FIG. 4 shows a scheme illustrating the proposed method of laser separation of the undoped upper layer of the homoepitaxial film from the undoped semiconductor substrate with a laser beam passing through the substrate and absorbed in the lower level of the homoepitaxial film doped with fine donor or acceptor impurities.

Separation of the undoped upper layer of the homoepitaxial gallium nitride film from the undoped semiconductor gallium nitride substrate with laser beam passing through the substrate and absorbed in lower layer of homoepitaxial film doped with fine donor impurities. FIG. 4 shows the scheme of laser separation of the undoped homoepitaxial gallium nitride film 202, 50 μm thick from the undoped semiconductor gallium nitride substrate 101, 200 μm thick using the doped lower layer 406 of the homoepitaxial film, 1 μm thick. Level of doping with fine silicon donor impurities in the lower layer 406 of the homoepitaxial gallium nitride film is $5\cdot10^{19}$ cm$^{-3}$ and exceeds the background concentration of fine silicon and oxygen donor impurities in the semiconductor substrate 101 and the upper layer of the homoepitaxial film 202 equaled $10^{17}$ cm$^3$.

For separating of the homoepitaxial gallium nitride film, $CO_2$ pulse pumped laser is used operating at the wave length $\lambda=10.6$ μm and generating pulses of energy 0.1 J, duration 50 ns and repetition rate 100 Hz.

Absorption factor of laser radiation with wave length $\lambda=10.6$ μm in the lower layer 406 of the homoepitaxial gallium nitride film doped with fine silicon donor impurities with concentration $5\cdot10^{19}$ cm$^{-3}$ equals $4\cdot10^4$ cm$^{-1}$, whereas the absorption factor of this laser radiation in the undoped semiconductor gallium nitride substrate 101 and in the undoped upper layer 402 of the homoepitaxial gallium nitride film with background concentrations of fine oxygen and silicon donors of $10^{17}$ cm$^{-3}$ equals $5 \cdot 10^1$ cm$^{-1}$.

The respective spectral dependences of the light absorption factor near the residual beams region which we calculated for the semiconductor gallium nitride crystals with different levels of doping with fine donor impurities are given in FIG. 6. The curves 601, 602 and 603 refer to the doping levels $10^{17}$, $10^{18}$ and $5 \cdot 10^{19}$ cm$^3$ respectively.

Scheme in FIG. 4 shows that the laser beam 203 passes through the substrate 101 and is focused into the spot 1 mm in diameter which provides the energy density of 10 J/cm$^2$. Under the action of infrared laser beam 203 of pulse $CO_2$ laser with wave length $\lambda=10.6$ μm focused into the spot 1 mm in diameter weakly absorbed in the undoped semiconductor gallium nitride substrate 101 and strongly absorbed in the lower layer 406 of the homoepitaxial gallium nitride film 202 doped with fine donor impurities, local heating of the lower layer 406 of the homoepitaxial film takes place in the region 404, defined by crossing of the infrared laser beam 203 with the homoepitaxial interface 405 between the undoped semiconductor substrate 101 and the doped lower layer 406 of the homoepitaxial film 202. Local heating above temperature 900° C. leads to chemical decomposition of gallium nitride crystal into gaseous nitrogen and liquid gallium in the region 404. Movement of the laser beam 203 focus with velocity of 10 cm/s in the horizontal plane which is parallel to homoepitaxial interface 405 leads to the subsequent decomposition of gallium nitride in the set of regions 404 and to weakening of the homoepitaxial interface 405 between the undoped semiconductor substrate 101 and the doped lower layer 406 of the homoepitaxial film. Then when pasting the undoped upper layer 402 of the homoepitaxial film on the temporary metallic, ceramic or plastic substrate and applying a small mechanical or thermomechanical stress it is possible to separate the undoped upper layer 402 of the homoepitaxial film with non-evaporated part of the lower doped layer 406 from the substrate 101.

Example 4

Separation of the undoped upper layer of the homoepitaxial gallium nitride film from the undoped semiconductor gallium nitride substrate with laser beam passing through the upper layer of the homoepitaxial film and absorbed in lower layer of homoepitaxial film doped with fine donor impurities.

Figure 5:
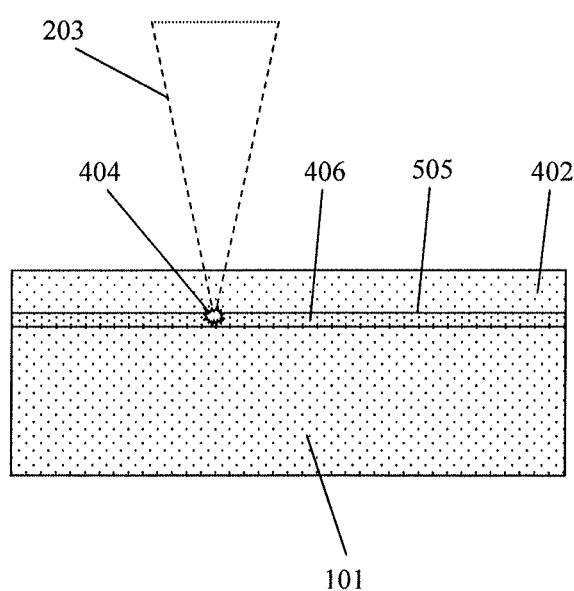
FIG. 5 shows a scheme illustrating the proposed method of laser separation of the undoped upper layer of the homoepitaxial film from the undoped semiconductor substrate with a laser beam passing through the upper undoped layer and absorbed in the lower level of the homoepitaxial film doped with fine donor or acceptor impurities.

FIG. 5 shows a scheme of laser separation of the undoped layer of the homoepitaxial gallium nitride film 202, 100 μm thick from the undoped semiconductor gallium nitride substrate 101, 2 μm thick using the doped lower layer 406 of the homoepitaxial gallium nitride film 1 μm thick. Level of doping with fine silicon donor impurities in the lower layer 406 of the homoepitaxial gallium nitride film is $5 \cdot 10^{19}$ cm$^3$, and exceeds background concentration of fine oxygen and silicon donor in the semiconductor substrate 101 and in the upper layer 402 of the homoepitaxial film equaled $10^{17}$ cm$^3$.

For separating of the homoepitaxial gallium nitride film, $CO_2$ pulse pumped laser is used operating at the wave length $\lambda=10.6$ μm and generating pulses of energy 0.1 J, duration 50 ns and repetition rate 100 Hz.

Absorption factor of laser radiation with wave length $\lambda=10.6$ μm in the lower layer 406 of the homoepitaxial gallium nitride film doped with fine silicon donor impurities with concentration $5 \cdot 10^{19}$ cm$^{-3}$ equals $4 \cdot 10^4$ cm$^{-1}$, whereas the absorption factor of this laser radiation in the undoped semiconductor gallium nitride substrate 101 and in the undoped upper layer 402 of the homoepitaxial gallium nitride film with background concentrations of fine oxygen and silicon donors of $10^{17}$ cm$^{-3}$ equals $5 \cdot 10^1$ cm$^{-1}$.

The respective spectral dependences of the light absorption factor near the residual beams region which we calculated for the semiconductor gallium nitride crystals with different levels of doping with fine donor impurities are given in FIG. 6. The curves 601, 602 and 603 refer to the doping levels $10^{17}$, $10^{18}$ and $5 \cdot 10^{19}$ cm$^3$ respectively.

Scheme in FIG. 5 shows that the laser beam 203 passes through the upper layer 402 of the homoepitaxial film and is focused into the spot 1 mm in diameter which provides the energy density of 10 J/cm$^2$. Under the action of infrared laser beam 203 of pulse $CO_2$ laser with wave length $\lambda=10.6$ μm focused into the spot 1 mm in diameter weakly absorbed in the undoped upper layer 402 of the homoepitaxial gallium nitride film and strongly absorbed in the lower layer 406 of the homoepitaxial gallium nitride film doped with fine donor impurities, local heating of the lower layer 406 of the homoepitaxial gallium nitride film takes place in the region 404 defined by crossing of the infrared laser beam 203 with the interface 505 between the undoped upper layer 402 and the doped lower layer 406 of the homoepitaxial gallium nitride film. Local heating above temperature 900° C. leads to chemical decomposition of gallium nitride crystal into gaseous nitrogen and liquid gallium in the region 404. Movement of the laser beam 203 focus with velocity of 10 cm/s in the horizontal plane which is parallel to the interface 405 leads to the subsequent decomposition of gallium nitride in the set of regions 404 and to weakening of the interface 405 between the undoped upper layer 402 and the doped lower layer 406 of the homoepitaxial film. Then when pasting the undoped upper layer 402 of the homoepitaxial film on the temporary metallic, ceramic or plastic substrate and applying a small mechanical or thermomechanical stress it is possible to separate the undoped upper layer 402 of the homoepitaxial film from the non-evaporated part of the lower doped layer 406 and from the substrate 101.

Example 5

Separation of the undoped homoepitaxial silicon carbide 4H-SiC film from the semiconductor silicon carbide 4H-SiC substrate doped with fine donor impurities by means of the laser beam passing through the homoepitaxial film.

FIG. 3 shows a scheme of laser separation of the undoped homoepitaxial silicon carbide 4H-SiC film 202, 100 μm thick from the semiconductor silicon carbide 4H-SiC substrate 101, 400 μm thick. The background concentration of the fine donors in the epitaxial film 202 is less than $10^{17}$ cm$^{-3}$, and essentially less than the concentration of the fine nitrogen donor impurities in the doped semiconductor substrate 101 equaled $5 \cdot 10^{19}$ cm$^{-3}$.

For separating of the homoepitaxial silicon carbide 4H-SiC film, CO pulse pumped laser is used operating at the wave length $\lambda=5.2$ μm and generating pulses of energy 0.4 J, duration 50 ns and repetition rate 10 Hz. Absorption factor of laser radiation with wave length $\lambda=5.2$ μm in the undoped homoepitaxial silicon carbide 4H-SiC film 202, with the background concentration of the fine donors less than $10^{17}$ cm$^{-3}$ is 10 cm$^{-1}$ (A. M. Hofmeister, K. M. Pitman, A. F. Goncharov, and A. K. Speck The Astrophysical Journal, 696:1502-1516, 2009 May 10), whereas the absorption factor of this radiation in the semiconductor silicon carbide 4H-SiC substrate 101 doped with the fine nitrogen donor impurities of concentration $5 \cdot 10^{19}$ cm$^{-3}$ exceeds $10^4$ cm$^{-1}$.

Scheme in FIG. 3 shows that the infrared laser beam 203 passes through the homoepitaxial film 202 and is focused into the spot 1 mm in diameter which provides the energy density of 50 J/cm².

Under the action of infrared laser beam 203 of pulse CO laser with wave length $\lambda=5.2$ μm focused into the spot 1 mm in diameter weakly absorbed in the undoped homoepitaxial silicon carbide 4H-SiC film 202 and strongly absorbed in the semiconductor silicon carbide 4H-SiC substrate 101 doped with the fine donor impurities, local heating of the substrate 101 takes place in the region 204, defined by crossing of the infrared laser beam 203 with the interface 205 between the doped semiconductor substrate 101 and undoped homoepitaxial film 202. Local heating to temperature above 2800° C. leads to chemical decomposition of silicon carbide 4H-SiC of the gallium nitride crystal into silicon and carbon in the region 204. Movement of the laser beam 203 focus with velocity of 2 cm/s in the horizontal plane which is parallel to the interface 205 leads to subsequent decomposition of silicon carbide 4H-SiC in the set of regions 204 and to weakening of the interface 205 between the doped semiconductor substrate 101 and the undoped homoepitaxial film 202. Then when pasting the epitaxial film 202 on the temporary metallic, ceramic or plastic substrate and applying a small mechanical or thermomechanical stress it is possible to separate the epitaxial film 202 from the substrate 101.

Example 6

Separation of weakly doped homoepitaxial silicon film from the semiconductor silicon substrate strongly doped with fine boron acceptor impurities using laser beam passing through the homoepitaxial film.

FIG. 3 shows the scheme of laser separation of weakly doped homoepitaxial silicon film 202, 50 μm thick from the semiconductor silicon substrate 101, 700 μm thick. Concentration of the fine boron acceptor impurities equals $10^{17}$ cm³, and essentially less than the concentration of the fine boron acceptor impurities in the doped semiconductor substrate 101 equaled $10^{19}$ cm$^{-3}$.

For separating of the homoepitaxial silicon film, $CO_2$ pulse pumped laser is used operating at the wave length $\lambda=10.6$ μm and generating pulses of energy 0.1 J, duration 50 ns and repetition rate 100 Hz.

Absorption factor of laser radiation with the wave length $\lambda=10.6$ μm in the weakly doped homoepitaxial silicon film 202 with concentration of fine acceptors of $10^{17}$ cm³ is 12 cm$^{-1}$ (Hara, H. and Y. Nishi, J. Phys. Soc. Jpn 21, 6, 1222, 1966), whereas the absorption factor of this radiation in the semiconductor silicon substrate 101 doped with the fine boron acceptor impurities of concentration $10^{19}$ cm³ equals 3000 cm$^{-1}$.

Scheme in FIG. 3 shows that the infrared laser beam 203 passes through the homoepitaxial film 202 and is focused into the spot 0.5 mm in diameter which provides the energy density of 40 J/cm².

Under the action of infrared laser beam 203 of pulse $CO_2$ laser with wave length $\lambda=10.6$ μm focused into the spot 0.5 mm in diameter weakly absorbed in the undoped homoepitaxial silicon film 202 and strongly absorbed in the semiconductor silicon substrate 101 doped with fine boron acceptor impurities, local heating of the substrate 101 takes place in the region 204, defined by crossing of the infrared laser beam 203 with the interface 205 between the strongly doped semiconductor substrate 101 and weakly doped homoepitaxial film 202. Local heating to temperature above 1400° C. leads to partial melting and amorphicity of the silicon crystal in the region 204. Movement of the laser beam 203 focus with velocity of 20 cm/s in the horizontal plane which is parallel to the interface 205 leads to subsequent melting and amorphycity of silicon crystal in the set of regions 204 and to weakening of the interface 205 between the strongly doped semiconductor substrate 101 and weakly doped homoepitaxial film 202. Then when pasting the epitaxial film 202 on the temporary metallic, ceramic or plastic substrate and applying a small mechanical or thermomechanical stress it is possible to separate the epitaxial film 202 from the substrate 101.

Despite the fact that the present invention was described and illustrated by the examples of the invention embodiments it should be noted that the present invention is in no case limited by the examples given.

The invention claimed is:

1. A method of laser separation of an epitaxial film or of an epitaxial film layer from a growth substrate of an epitaxial semiconductor structure, the method comprising:
   using selective doping of some regions of the epitaxial semiconductor structure with fine donor or acceptor impurities when growing the epitaxial film or the epitaxial film layer, so that a resulting concentration of fine donor or acceptor impurities in selectively doped regions essentially exceeds a background concentration in undoped regions;
   gluing the epitaxial semiconductor structure onto a temporary substrate;
   directing a focused laser beam of a laser to the epitaxial semiconductor structure glued onto the temporary substrate so as to place a beam focus of the focused laser beam in the selectively doped regions of the epitaxial semiconductor structure in which absorption of laser radiation takes place;
   moving the focused laser beam so as to scan the selectively doped regions of the epitaxial semiconductor structure with the beam focus with partial thermal decomposition of the selectively doped regions and weakening of their mechanical strength; and
   separating the epitaxial film or the epitaxial film layer from the growth substrate or from the growth substrate with a part of the epitaxial film by applying mechanical or thermomechanical stress.

2. The method according to claim 1, wherein the epitaxial film or the epitaxial film layer is grown by a homoepitaxy method.

3. The method according to claim 1, wherein a selectively doped region is a substrate or a surface layer of the substrate.

4. The method according to claim 1, wherein a selectively doped region is the epitaxial film or a lower layer of the epitaxial film.

5. The method according to claim 1, wherein a material of the epitaxial semiconductor structure is a semiconductor from an element of fourth group of the periodic system.

6. The method according to claim 1, wherein a material of the epitaxial semiconductor structure is a semiconductor compound from elements of fourth group of the periodic system.

7. The method according to claim 1, wherein a material of the epitaxial semiconductor structure is a semiconductor compound from elements of third and fifth groups of the periodic system.

8. The method according to claim 1, wherein a material of the epitaxial semiconductor structure is a semiconductor compound from elements of second and sixth group of the periodic system.

9. The method according to claim 1, wherein for separating the epitaxial film or the epitaxial film layer from the growth substrate, the method comprises using the laser with a wave length which is within following wave length ranges: for silicon, germanium and gallium arsenide semiconductors within a wave length range of 6 µm≤λ≤48 µm; for gallium nitride within a wave length range of 4 µm≤λ≤32 µm; for silicon carbide within a wave length range of 3 µm≤λ≤24 µm; for alumina nitride within a wave length range of 2.5 µm≤λ≤20 µm; and for diamond within a wave length range of 2 µm≤λ≤16 µm.

10. The method according to claim 1, wherein the laser is an infrared gas pulse pumped $CO_2$ or CO laser.

* * * * *